United States Patent [19]

Malba et al.

[11] Patent Number: 6,114,097
[45] Date of Patent: *Sep. 5, 2000

[54] 3-D LASER PATTERNING PROCESS UTILIZING HORIZONTAL AND VERTICAL PATTERNING

[75] Inventors: Vincent Malba, Livermore; Anthony F. Bernhardt, Berkeley, both of Calif.

[73] Assignee: The Regents of the University of California, Oakland, Calif.

[ * ] Notice: This patent is subject to a terminal disclaimer.

[21] Appl. No.: 08/387,495

[22] Filed: Feb. 13, 1995

[51] Int. Cl.⁷ .................................................. G03F 7/40
[52] U.S. Cl. .................... 430/314; 430/313; 430/315; 430/318; 430/329
[58] Field of Search .................... 430/313, 314, 430/315, 318, 311, 329

[56] References Cited

U.S. PATENT DOCUMENTS

| | | | |
|---|---|---|---|
| 4,992,847 | 2/1991 | Tuckerman | 357/68 |
| 5,017,509 | 5/1991 | Tuckerman | 437/182 |
| 5,049,421 | 9/1991 | Kosh | 428/34.4 |
| 5,241,450 | 8/1993 | Bernhardt et al. | 361/689 |
| 5,302,778 | 4/1994 | Maurinus | 174/52.4 |

*Primary Examiner*—Christopher G. Young
*Attorney, Agent, or Firm*—Alan H. Thompson; L. E. Carnahan

[57] ABSTRACT

A process which vastly improves the 3-D patterning capability of laser pantography (computer controlled laser direct-write patterning). The process uses commercially available electrodeposited photoresist (EDPR) to pattern 3-D surfaces. The EDPR covers the surface of a metal layer conformally, coating the vertical as well as horizontal surfaces. A laser pantograph then patterns the EDPR, which is subsequently developed in a standard, commercially available developer, leaving patterned trench areas in the EDPR. The metal layer thereunder is now exposed in the trench areas and masked in others, and thereafter can be etched to form the desired pattern (subtractive process), or can be plated with metal (additive process), followed by a resist stripping, and removal of the remaining field metal (additive process). This improved laser pantograph process is simpler, faster, move manufacturable, and requires no micro-machining.

28 Claims, 3 Drawing Sheets

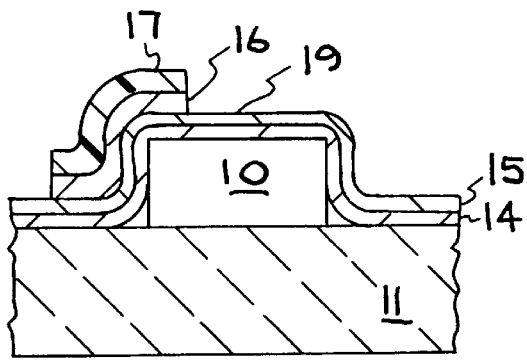
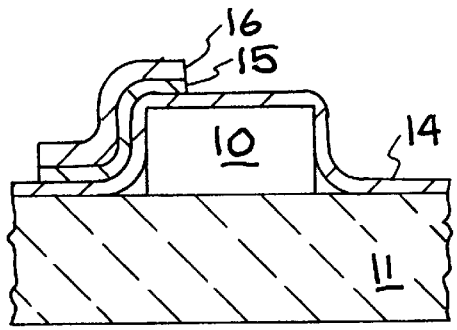
FIG. 7　　　　FIG. 8
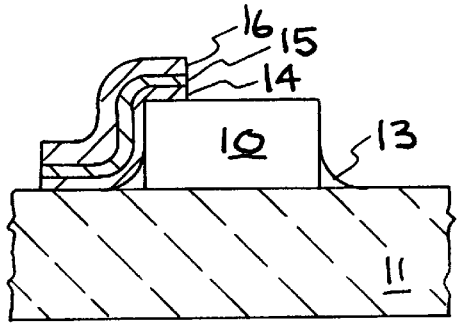
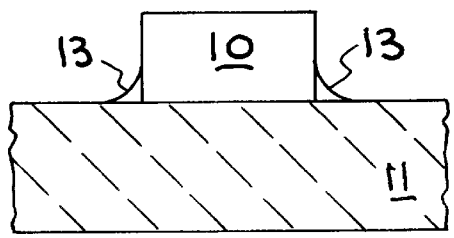
FIG. 9　　　　FIG. 10
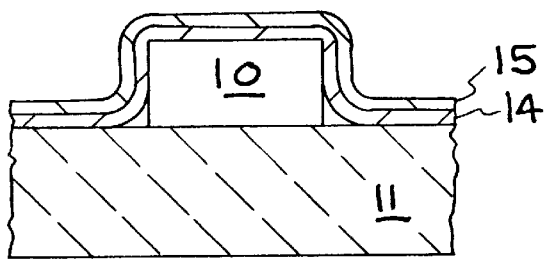
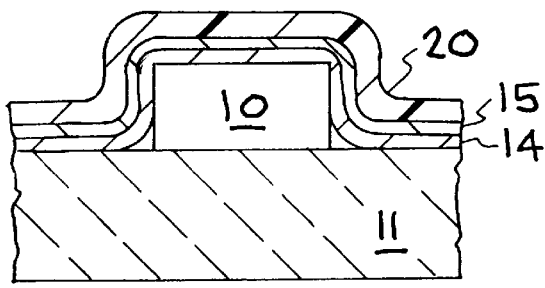
FIG. 11　　　　FIG. 12

3-D LASER PATTERNING PROCESS UTILIZING HORIZONTAL AND VERTICAL PATTERNING

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to integrated circuit fabrication, particularly to the use of a directed light source, such as laser pantography, in the fabrication of integrated circuits, and more particularly to a three-dimensional (3-D) laser patterning process which involves the use of an isotropically deposited, photodefinable layer, such as electrodeposited photoresist, to pattern the 3-D surfaces.

Patterning in three dimensions has always been a difficult problem. Typical screening and photolithography permits the patterning of two dimensional surfaces with fine line features (screening can be used for patterns with lines greater than 0.002 inches, while photolithography can resolve line widths on the order of 0.5 $\mu$m). Neither process can be readily adapted for vertical surface patterning. Directed light sources, such as lasers, can be used to pattern three-dimensional surfaces. The exposure source (the laser beam) can be manipulated (steered) to any appropriate surface through the use of computer controlled optics and stages. The laser is not used simply as a light source that shines through a mask as in conventional lithography, but is focused to the required size and rastered with computer control to form the pattern which has been stored as a computer file. This three dimensional laser patterning is sometimes referred to as Laser Pantography or laser direct-writing.

The laser must interact with a light or heat sensitive material in order to form a pattern. Laser pantography can be used with a large number of different chemical/physical systems to form the patterns required. The earliest systems involved gases, such as nickel carbonyl, which deposited metal in the areas in which the laser scanned. These processes were extremely slow ($\mu$m/sec time frame), and therefore have found utility only for niche applications (e.g. circuit repair) in the semiconductor industry. Other processes use the laser to etch a maskant material to form the pattern. This type of process is considerably faster, but cannot compete with the speed of screening or conventional lithography. Both gas phase deposition and etching require noxious gases in enclosed environments. In recent years chemical transformation of seed layers with laser exposure has provided greater patterning speed and a cleaner process environment.

One such material is photoresist, which is chemically transformed by light to form a desired pattern. The problem with resist is that it is usually spun onto flat surfaces. In order to pattern three-dimensions, the resist must conformally cover vertical and horizontal surfaces equally well.

Laser pantography (computer controlled laser direct-write patterning) is currently used to pattern metal interconnections of various kinds. In particular, laser pantography is being considered for interconnecting integrated circuit (IC) chips to multichip module substrates (or printed wire board substrates), by patterning the top of the chip, the sidewall of the chip and the surface of the substrate. Laser pantography is also being used to form a continuous pattern on the top, sides and bottom of packaging substrates for the purpose of interconnecting several multichip packages into a single package. For example, thin film wiring can be fabricated down beveled edges of the chips using laser pantography, as described and illustrated in U.S. Pat. No. 4,992,847 issued Feb. 12, 1991 to D. B. Tuckerman.

The interconnection of integrated circuit (IC) chips to substrates (e.g. multichips, modules, printed circuit boards, lead frames) is being accomplished in the industry today primarily with wire bonding, tape automated bonding, or with flip-chip solder-bump bonding. Laser pantography can also be used to interconnect chips to substrates as pointed out above. However, in order for laser pantography to compete with other chips/substrate interconnection techniques, it must be manufacturable (simple, inexpensive, environmentally safe). One method for utilizing laser pantography is to pattern the sidewall of the chip itself, and this technique has been developed, as exemplified by the above-referenced U.S. Pat. No. 4,992,847, and produces a higher density of metal circuits than the other techniques, with better electrical and thermal properties.

For example, a type of photoresist, or photodefinable layer, has been introduced commercially which permits a conformal covering of vertical and horizontal surfaces. It has been recognized that by using this new resist, laser patterning can be carried out in air, and three-dimensional (3-D) laser patterning can be processed very fast compared with earlier laser processes, and is simple and fast enough to be a manufacturable process. By the recognition that this newly introduced photoresist, an isotropically deposited photodefinable layer, can be used in techniques such as laser pantography, the process of this invention has been developed for the interconnection of integrated circuit chips to substrates, as well as laser patterning on surfaces. The process of this invention also allows laser pantography, for example, to be used to pattern the top, side, and bottom of substrates, in order for signals to be brought from one side to the other, and allow substrate-to-substrate interconnection in a multichip module stack, and allows chip-to-chip interconnection in a vertical multi-chip stack.

SUMMARY OF THE INVENTION

It is an object of the invention to provide a laser patterning process.

A further object of the invention is to provide a process for the interconnection of integrated circuit chips to substrate using techniques such as laser pantography.

A further object of the invention is to provide a three-dimension laser patterning process which can be carried out in air.

Another object of the invention is to use fillets in a laser patterning process.

Another object of the invention is to provide a three-dimensional laser patterning process which utilizes a photodefinable layer, such as an electrodeposited photoresist, to pattern surfaces.

Another object of the invention is to provide for the use of a technique, such laser pantography, in patterning top, side, and bottom of substrates to allow signals to be brought from one side to the other side of the substrate, to allow substrate-to-substrate interconnection in a multi-chip module stack, and to allow die to die interconnection in a multi-chip stack (a vertical array of chips).

Other objects and advantages of the present invention will become apparent from the following description. The process of this invention uses commercially available photodefinable layer, such as electrodeposited photoresist (EDPR), to pattern three-dimensional (3-D) surfaces. A metal layer is first deposited onto a surface to be patterned. The photoresist (negative or positive) is then electroplated onto the metal surface. The EDPR covers the surface conformally, coating the vertical as well as horizontal surfaces. A laser pantograph, for example, then patterns the photoresist, which is subsequently developed in standard, commercially available developer. The metal layer, which is now exposed in some areas and masked in other areas, can be etched to form the desired pattern (subtractive process), or can be plated with metal (additive process), followed by a resist stripping, and removal of the remaining field metal (additive process). This process is a vast improvement over previous laser pantography processes because it is simpler, faster, more manufacturable, can be carried out in air, and no micro machining is required. This process will make laser patterned interconnection of IC chips to substrates a viable manufacturing process. The process can be used to pattern electrical circuits on both vertical and horizontal surfaces, and pattern materials in three dimensions for a variety of applications including electronics, electronic packaging, manufacture of micro-machines, wave guides, gratings, holographs and specialized optics. It can also be used artistically to form patterns on a number of materials. In summary, the process of this invention is highly manufacturable, and represents improvements which permit the realization of 3-D laser patterning on an industrial scale.

BRIEF DESCRIPTION OF THE DRAWINGS

FIGS. 2–9 illustrate the subtractive process.

FIGS. 10–17 illustrate the additive process.

DETAILED DESCRIPTION OF THE INVENTION

Figure 1:
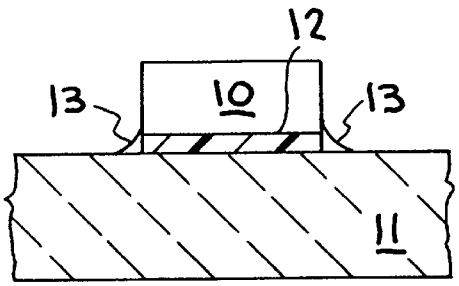
FIG. 1 is a cross-section of a chip/substrate interconnection using a fillet in accordance with the invention.

The invention is divided into an improved laser pantography process which utilizes an isotropically deposited, photodefinable layer, such as an electrodeposited photoresist (EDPR), wherein: 1) it can be carried out in air, 2) it does not require micromachining of the sidewall of the chip after attachment to the substrate, 3) it permits the patterning of substrates which are heat sensitive or which have heat sensitive films on them, 4) the laser patterning procedure is considerably faster than previous processes because a substantially lower photon flux is required to expose the resist, 5) it simplifies the overall interconnection process, reducing the number of operational steps, and thereby improving the yield, 6) the process is considerably less expensive to install and operate compared with previous processes, and 7) the process allows vertical laser patterning by utilizing a beam angle other than 90° to the part. An isotropically deposited layer can be formed evenly on both vertical and horizontal surfaces of a chip and/or substrate.

The 3-D laser patterning process as described in greater detail hereinafter uses a commercially available photodefinable layer, such as an electrodeposited photoresist (EDPR) such as PEPR-2400 (positive) or Eagle 2100 ED (negative), each made by Shipley Company, to pattern three-dimensional (3-D) surfaces. First, at least one layer of metal is deposited onto the surface to be patterned, which may be a substrate for IC chips composed of silicon, ceramic, glass, plastic, FR-4 epoxy laminate, polyimide laminate, polyester laminate, for example, or another member or layer. Second, a layer of photoresist (negative or positive) is then electroplated onto the metal surface, with the EDPR covering the surface conformal, coating the vertical as well as the horizontal surfaces. A directed light source, such as a laser pantograph, then patterns the photoresist, which is subsequently developed in a standard, commercially available developer, such as 1% sodium carbonate for PEPR-2400, or aqueous lactic acid, exemplified by Eagle 2005, made by Shipley Company for Eagle 2100 ED. The metal layer, which is now exposed in some areas and masked in other areas, can now be etched to form the desired pattern (subtractive process), or can be plated with metal (additive process), followed by stripping the remaining photoresist, and removal of the remaining field metal (additive process). This process is a vast improvement over prior known laser pantography processes because it can be carried out in air, and thus is simpler, faster, more manufacturable, and no micro machining is required. By this invention laser patterned interconnection of IC chips to substrates can be carried out as a viable manufacturing process.

Prior to setting forth specific examples for carrying out the improved laser patterning process of this invention, the process is described generally as follows. The process starts with the sputter deposition of an adhesive layer, such as titanium (Ti), titanium tungsten (TiW), chromium (Cr), titanium nitride (TN), tantalum (Ta), or tungsten (W), having a thickness of 100 Å to 2000 Å, followed by a layer of copper (Cu), gold (Au), nickel (N), or platinum (Pt), with a thickness of 1000 Å to 20 $\mu$m. Two process paths are now possible: a subtractive process and an additive process. In the subtractive process: copper (for example) is deposited onto the sample or part to the thickness desired for the metal lines (thickness of 1 $\mu$m to 20 $\mu$m). Then an isotropically deposited photodefinable layer, such as an electrodeposited photoresist (EDPR) is plated onto the sample or part. The sample or part is then dried and soft-baked (temperature of 85° C. to 95° C. for a time period of 5 min. to 30 min.). The sample can then be laser exposed (flux of 200 W/cm$^2$ to 2000 W/cm$^2$, and wavelength of 320 nm to 400 nm, followed by developing in an aqueous developer. The copper is etched (with an etchant of ammonium persulfate, sodium persulfate, ferric chloride, or cupric chloride) using the resist as a mask. The adhesion layer is etched next, using an etchant of HF/ammonium fluoride, ammonia hydroxide plus hydrogen peroxide, or RIE/plasma etched with sulfur hexafluoride (SF$_6$) or carbon tetrafluoride (CF$_4$), followed by resist removal by acetone, acetonitrile, n-methyl pyrolidone, or other polar solvent. In the additive process an EDPR is plated directly onto the thin (1000 Å—1 $\mu$m) copper film, soft baked (temperature of 85° C. to 95° C. and time of 8 min. to 12 min.), exposed by the laser (flux of 500 W/cm$^2$ to 2000 W/cm$^2$, wavelength of 320 nm to 400 nm), and developed in an aqueous developer, such as 1% sodium carbonate in water, or 1% sodium hydroxide in water. The part or sample is then plated with copper (thickness of 1 $\mu$m to 20 $\mu$m) in the trenches which have been developed in the resist. The resist is then removed, such as by acetonitrile, n-methlyl pyrolidone, or 2% sodium hydroxide at 60° C., and a short copper etch (using an etchant of ammonium persulfate or ferric chloride) is performed to remove the seed layer. The adhesion layer is then removed by HF/ammonium fluoride or RIE/plasma etched with SF$_6$ or CF$_4$.

In order to apply the process to interconnecting IC chips to a substrate via sidewall patterning, the chips must be attached to the substrate with an adhesive (e.g. eutectic solder, epoxy, thermoset adhesive, or thermoplastic adhesive). If the die bond adhesive forms a continuous fillet around the base of the die, then laser patterning will be successful. If the die bond is insufficient or inconsistent, or if the die bonding material has been recessed under the chip, a fillet can be applied using an adhesive material such as epoxy or polyimide to the chip/substrate interface. This fillet allows stringent control of the chip/substrate interface which is crucial to successful interconnections.

FIG. 1 illustrates this feature, wherein a chip 10 is secured to a substrate 11 via a die bond adhesive 12, with fillets 13 being formed along the die/substrate interface.

The following examples set forth specific procedures for carrying out the 3-D laser patterning process of this invention utilizing: 1) a chip-to-substrate process, 2) a subtractive process, and 3) an additive process.

EXAMPLE I

Chip-to-Substrate Process

The substrate, a 4 inch silicon wafer, is covered with a multilayer of titanium (500 Å), gold (500 Å), tin (8000 Å), and gold (500 Å) in a three target RF diode sputter deposition system. A bond pad matching the footprint of the die to be bonded is patterned on top of the multilayer using standard photoresist processing (Shipley AZ-1350 resist, spun on the wafer at 1500 rpm, soft baked at 90° C. for 20 minutes, and exposed on a contact printer for 30 seconds at 100 mW/cm$^2$. The resist is developed using developer KTI-1300 mixed 1:1 with water). The pattern is transferred through the multilayer using diluted aqua regia as the etchant for the gold and tin. The etch is performed at room temperature for 3 minutes. Following the gold/tin etch, the titanium is removed in an RIE plasma etcher (50 mtorr, 20 sccm sulfurhexafluoride, 150 W RF power for 2.5 minutes).

In a separate sputter deposition, a titanium (500 Å), gold (17000 Å) multilayer is deposited on the backside of a silicon integrated circuit. The bonding procedure is as follows: the die is carefully positioned over the bond pad on the substrate. Pressure is applied uniformly to the top of the die while the temperature is raised to 300° C. The substrate and die are held at 300° C. for 20 minutes, and are then slowly cooled to <100° C. before the pressure is released. An argon ambient is used throughout the bonding process.

After the part has reached room temperature, an epoxy fillet is formed along the interface of the substrate and die sidewall using a commercially available 2-part epoxy with an open time of 30 minutes. The two parts (the resin and the hardener) are mixed 1:1, and the mixture is applied to the interface with a drafting pen, utilizing a binocular microscope for precision application. The process has to proceed quickly to prevent the epoxy gelling in the pen.

EXAMPLE II

The Subtractive Process

Figure 2:
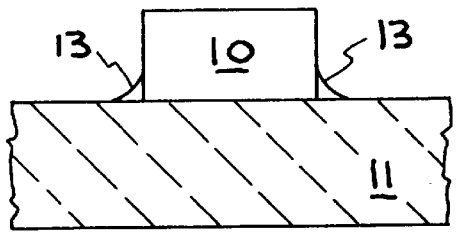
Figure 3:
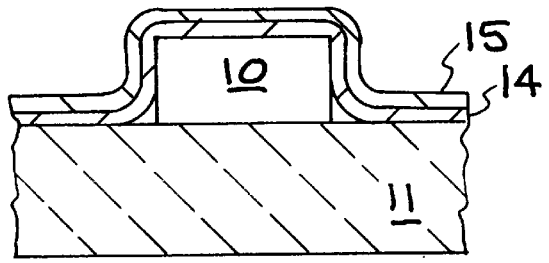
Figure 4:
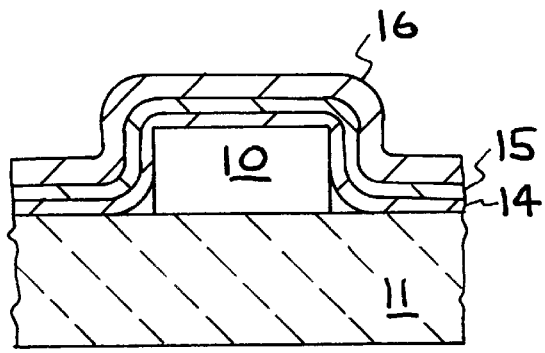
Figure 5:
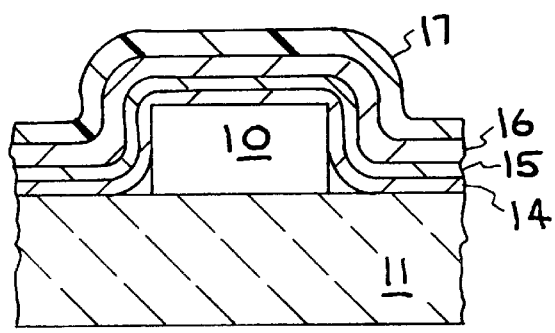

A sputter deposition of a titanium (500 Å), copper (2000 Å) multilayer (layers 14 and 15) is performed on the bonded part described in Example I (see FIGS. 2 and 3). A copper plating bath is then used to increase the copper thickness to the desired line thickness (see FIG. 4). The copper plating 16 uses an acidic copper sulfate solution at 35° C. for 15 minutes. The part is cleaned with 5% sulfuric acid in water, rinsed thoroughly, and electroplated with Shipley's Eagle 2100 ED photoresist 17 at 30° C. for 30 seconds at 75 volts (see FIG. 5), followed by a 90° C. softbake for 10 minutes.

Figure 6:
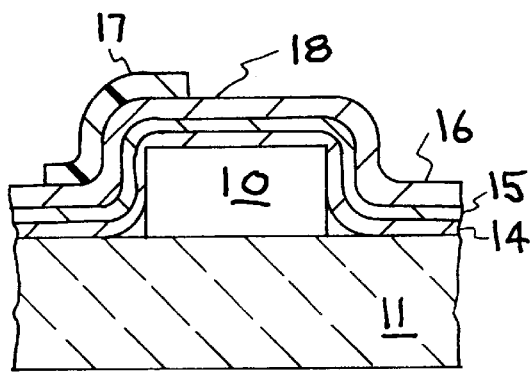

The part is patterned, as indicated at 18, using a laser pantography apparatus consisting of an argon-ion laser configured for ultraviolet operation (output is between 350 and 370 nm) and a Sun 360 workstation running a UNIX operating system (see FIG. 6). The beam is fixed; x, y, z, and theta stages move the part with respect to the laser beam. A secondary beam line is used for patterning vertical surfaces such as die sidewalls. A mirror is used to switch the laser beam between the normal and the angled beam paths. The translational stages are run at 10 mm/s, and the laser power is 10 mW incident in an area 150 $\mu$m$^2$.

The part is developed, as indicated at 18, with Shipley's Eagle 2005 developer (1 part in 24 parts water) at 38° C. for 2 minutes (see FIG. 6). The part is then hard baked at 120° C. for 20 minutes. The copper plating 16 is etched, as indicated at 19, with a 10% ammonium persulfate solution at 23° C. (room temperature) in a spray etcher for 90 minutes (see FIG. 7). The copper layer 15 is etched (see FIG. 8) with a 10% ammonium persulfate solution at 23° C. The resist 17 is stripped (see FIG. 8), using acetonitrile at 60° C., and the titanium layer 14 is RIE plasma etched (see FIG. 9) at 50 mtorr, 20 sccm SF6, at 150 W for 2.5 minutes.

EXAMPLE III

The Additive Process

A sputter deposition of a titanium (500 Å), copper (2000 Å) multilayer 14 and 15 (seed layer for plating), see FIGS. 10 and 11, is performed on the bonded part described in Example I. The part is cleaned with 5% sulfuric acid in water, and then electroplated (see FIG. 12) with Shipley's PEPR-2400 photoresist 20 at 27° C. for 30 seconds at 300 volts, followed by a 90° C. softbake for 10 minutes. The resultant resist film 20 thickness is 7 $\mu$m.

Figure 13:
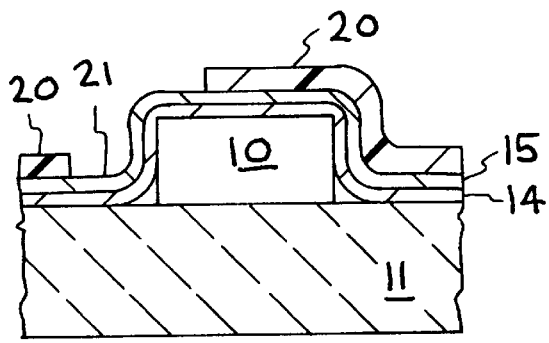

The part is patterned (see FIG. 13) using a laser pantography apparatus consisting of an argon-ion laser configured for ultraviolet operation (output is between 350 and 370 nm) and a Sun 360 workstation running a UNIX operating system. The beam is fixed; x, y, z, and theta stages move the part with respect to the laser beam. A secondary beam line is used for patterning vertical surfaces such as die sidewalls. A mirror is used to switch the laser beam between the normal and the angled beam paths. The translational stages are run at 10 mm/s, and the laser power is 16 mW incident in an area 150 $\mu$m$^2$.

Figure 14:
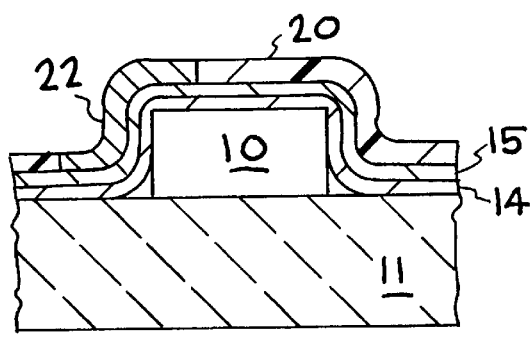
Figure 15:
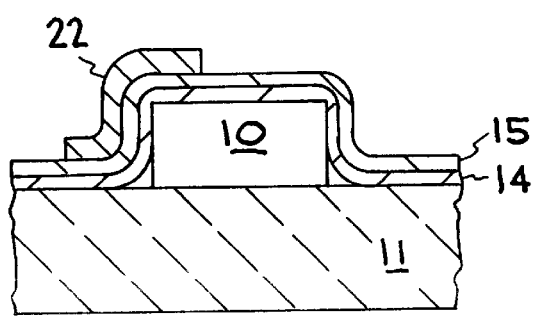
Figure 16:
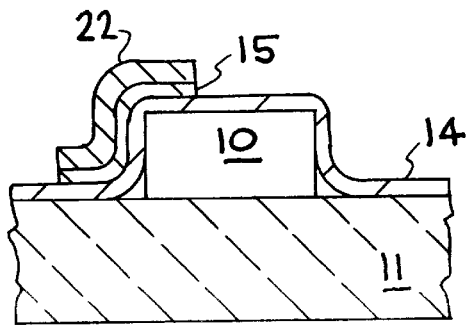
Figure 17:
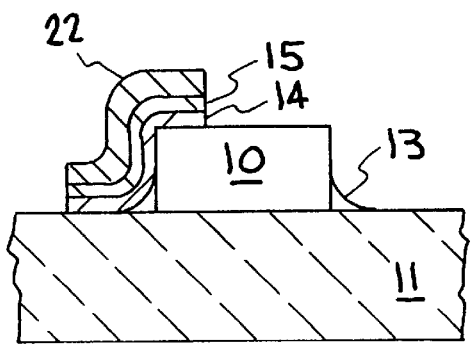

The part is developed, as indicated at 21, with a 1% solution of sodium carbonate in water for 3 minutes at 35° C. The part is placed in a plasma barrel asher at 150 W, 100 mtorr, and 20 sccm of oxygen for 3 minutes to descuum the exposed copper (see FIG. 13). Next, copper 22 is plated (see FIG. 14) in the areas from which resist has been developed away (plating conditions: 35° C., in acidic copper sulfate for 12 minutes). The resist 20 is stripped (see FIG. 15) with acetonitrile at 60° C., and the copper seed layer 15 is etched (see FIG. 16) with a 10% ammonium persulfate solution at 23° C. (room temperature) in a spray etcher. The titanium 14 is etched (see FIG. 17) with 20 sccm SF6 in an RIE etcher at 150 W and 50 mtorr pressure for 2.5 minutes.

It has thus been shown that the present invention provides an improved 3-D laser patterning process, which involves the use of an isotropically deposited, photodefinable layer, such as electrodeposited photoresist (EDPR). The process of this invention is simpler, faster, can be carried out in air, no micro machining required, and thus is adaptable to large scale economic manufacturing, compared to other laser patterning processes. This process can also be used for interconnection of IC chips to substrates in a viable manufacturing process. The process can be used to pattern electrical circuits on both vertical and horizontal surfaces, and thus has wide application including electronics, electronic packaging, various manufacturing techniques, and can be used artistically to form patterns on various materials.

While specific examples have been set forth using specified materials and techniques to explain and demonstrate the invention, such are not intended to be limiting. Modifications and changes may become apparent to those skilled in the art, and it is intended that the invention be limited only by the scope of the appended claims.

What is claimed is:

1. A three-dimensional patterning process, comprising:
   depositing at least one metal layer on a surface to be patterned,
   isotropically depositing a layer of photoresist on vertical and horizontal surfaces of the thus deposited metal layer,
   patterning the photoresist on vertical and horizontal surface areas using a directed light source,
   developing the thus patterned areas of the photoresist to expose metal in the patterned areas,
   processing exposed metal in the patterned areas by a technique selected from a group consisting of etching the metal and plating the metal,
   stripping the remaining photoresist, and
   removing any of the unprocessed remainder of the metal layer.

2. The process of claim 1, wherein the step of patterning is carried out with a laser pantograph as the directed light source and at an angle other than 90° for vertical surfaces.

3. The process of claim 1, wherein the at least one metal layer is deposited by a sputtering technique.

4. The process of claim 1, wherein the photoresist was deposited by electroplating.

5. The process of claim 1, wherein the developing of the patterned areas of the photoresist was carried out using aqueous sodium carbonate or aqueous lactic.

6. The process of claim 1, wherein the exposed metal is etched by an etchant selected from the group consisting of ammonium persulfate, sodium persulfate ferric chloride, and cupric chloride.

7. The process of claim 1, wherein the exposed metal is plated by an acidic copper sulfate solution.

8. The process of claim 1, additionally including depositing an adhesion layer on the surface to be patterned prior to depositing the metal layer.

9. The process of claim 1, wherein the surface to be patterned is a substrate selected from the group consisting of silicon, glass, plastic, ceramic and laminated material.

10. The process of claim 1, wherein the surface to be patterned is of an artistic material.

11. The process of claim 1, wherein the photoresist is an electrodeposited photoresist, capable of covering the surface of the metal conformally, thereby coating the vertical as well as the horizontal surfaces thereof.

12. The process of claim 8, wherein the adhesion layer is composed of material, selected from the group consisting of Ti, TiW, Cr, Ta, TiN and W.

13. The process of claim 1, wherein the at least one metal layer is composed of metal selected from the group of copper, gold, nickel, and platinum.

14. A process for interconnecting IC chips to a substrate via sidewall patterning, comprising:
   attaching the chip to the substrate utilizing an adhesive, and
   forming a fillet at the region of connection following attaching the chip to the substrate.

15. The process of claim 14, wherein the chip is attached to the substrate by a film of an adhesive selected from the group consisting of eutectic solder, epoxy, thermoset adhesive, thermoplastic adhesive.

16. The process of claim 14, wherein the fillet is formed from an adhesive material.

17. A process for 3-D laser patterning, comprising:
   sputtering an adhesion layer on a surface of a substrate,
   depositing a film seed layer on the adhesive surface, and
   carrying out a subtractive process or an additive process on horizontal and vertical surfaces of the film seed layer following depositing the film seed layer.

18. The process of claim 17, wherein the subtractive process is carried out by:
   electroplating a layer of conductive metal on the film seed layer,
   applying an electrodeposited photoresist on the horizontal and vertical surfaces of the layer of conductive metal,
   drying and soft-baking the applied photoresist, exposing horizontal and vertical areas of the photoresist to laser patterning, developing the photoresist, etching the conductive metal exposed by the photoresist development,
   removing the remaining photoresist, and
   removing the remaining adhesive layer.

19. The process of claim 17, wherein the additive process is carried out by:
   applying a layer of electrodeposited photoresist directly onto horizontal and vertical surfaces of the film seed layer,
   soft-baking the photoresist,
   exposing horizontal and vertical surface areas of the photoresist to laser patterning,
   developing the patterned areas of the photoresist,
   depositing a conductive metal on exposed areas of the seed layer located in the patterned photoresist areas,
   removing the remaining photoresist, and
   removing the remaining seed layer and adhesive layer.

20. A three dimensional patterning process, comprising:
   isotropic deposition of a photodefinable layer on both vertical and horizontal areas of a surface,
   patterning at least one area on the layer by exposure of the photodefinable layer to a directed light source,
   developing the thus patterned areas to form exposed material
   processing the exposed material under the patterned areas, and
   stripping the remaining photodefinable layer.

21. The process of claim 20, wherein the step of exposure is carried out by a laser.

22. The process of claim 20, wherein the photodefinable layer is electroplated photoresist.

23. The process of claim 20, wherein the exposed material is metal and its processing consists of etching.

24. The process of claim 20, wherein the exposure step and developing step are carried out simultaneously by laser ablation.

25. The process of claim 20, wherein the processing consists of electroless deposition of metal.

26. A three dimensional patterning process comprising;
   depositing at least one seed layer on vertical and horizontal areas of a surface to be patterned,
   isotropic deposition of a photodefinable layer on the seed layer, exposing material under patterned horizontal and vertical areas of the layer,
developing the patterned areas,
processing the exposed material,
stripping the remaining photodefinable layer, and
removing any remainder of the seed layer.

27. The method of claim 26, wherein the seed layer consists of at least one metal layer.

28. The method of claim 26, wherein the processing consists of electroplating.

* * * * *